(12) United States Patent
Morii et al.

(10) Patent No.: US 7,394,196 B2
(45) Date of Patent: Jul. 1, 2008

(54) LIGHT EMITTING ELEMENT, DISPLAY DEVICE AND ELECTRONIC INSTRUMENT

(75) Inventors: Katsuyuki Morii, Lausanne (CH); Tomoyuki Okuyama, Chino (JP)

(73) Assignee: Seiko Epson Corporation, Tokyo (JP)

( * ) Notice: Subject to any disclaimer, the term of this patent is extended or adjusted under 35 U.S.C. 154(b) by 279 days.

(21) Appl. No.: 11/296,364

(22) Filed: Dec. 8, 2005

(65) Prior Publication Data
US 2006/0158100 A1 Jul. 20, 2006

(30) Foreign Application Priority Data
Jan. 14, 2005 (JP) ............... 2005-008406

(51) Int. Cl.
*H01J 1/62* (2006.01)
*H01J 63/04* (2006.01)
(52) U.S. Cl. ............ 313/506; 313/503; 313/504
(58) Field of Classification Search .......... 313/498–512
See application file for complete search history.

(56) References Cited

U.S. PATENT DOCUMENTS

| | | | |
|---|---|---|---|
| 2002/0135296 A1* | 9/2002 | Aziz et al. | 313/504 |
| 2005/0035710 A1* | 2/2005 | Tanase et al. | 313/506 |
| 2005/0253503 A1* | 11/2005 | Stegamat et al. | 313/504 |

FOREIGN PATENT DOCUMENTS

| | | |
|---|---|---|
| JP | A-10-012377 | 1/1998 |
| JP | A-10-153967 | 6/1998 |
| JP | A-11-040358 | 2/1999 |

OTHER PUBLICATIONS

C. W. Tang et al., "Organic electroluminescent diodes," Appl. Phys Lett. 51 (12), Sep. 21, 1987, pp. 913-915.
J. C. Carter et al., "Operating stability of light-emitting polymer diodes based on poly (p-phenylene vinylene)", Appl. Phys. Lett. 71 (1), Jul. 7, 1997, pp. 34.36.
G. Gustafsson et al., "Flexible light-emitting diodes made from soluble conducting polymers," Nature, vol. 357, Jun. 11, 1992, pp. 477-479.

* cited by examiner

*Primary Examiner*—Karabii Guharay
*Assistant Examiner*—Bumsuk Won
(74) *Attorney, Agent, or Firm*—Oliff & Berridge, PLC

(57) ABSTRACT

A light emitting element, including an anode, a cathode, a hole transport layer disposed between the anode and the cathode and in the side of the anode, and a light emitting layer disposed between the anode and the cathode and in the side of the cathode, wherein the hole transport layer includes, a first region disposed in the side of the anode and composed of a first organic polymer, and a second region disposed in the side of the light emitting layer and composed of a second organic polymer having a weight-average molecular weight different from the weight-average molecular weight of the first organic polymer.

18 Claims, 7 Drawing Sheets

LIGHT EMITTING ELEMENT, DISPLAY DEVICE AND ELECTRONIC INSTRUMENT

BACKGROUND OF THE INVENTION

1. Technical Field

The present invention relates to a light emitting element, a display device and an electronic instrument.

2. Related Art

An organic electroluminescence element (herein after referred to as an organic EL element) having a structure composed of at least one light emitting organic layer (an organic electroluminescence layer) sandwiched by a cathode and an anode can be driven by applying a significantly low voltage in comparison with a inorganic EL element, and can be manufactured as elements with various luminescent colors. Such an element is described in documents such as, for example, Appl. Phys. Lett. 51(12), 21 Sep. 1987, p. 913, Appl. Phys. 71(1), 7 Jul. 1997, p. 34, Nature 357,477 1992, JP-A-10-153967, JP-A-10-12377, or JP-A-11-40358.

In order for obtaining a higher-performance organic EL element, aggressive researches including development and improvement of materials, and proposition of various device structures are presently preformed.

Further, elements with various luminescent colors or high-intensity and high-efficiency elements have been developed as the organic EL elements, and various practical applications such as an application for pixels of a display device or an application for a light source have been studied.

And, various investigations are now in progress aiming for further improvement of luminous efficiency required for practical applications.

SUMMARY

An advantage of the invention is to provide a light emitting element superior in the emission efficiency, a display device equipped with such a light emitting element having high reliability, and an electronic instrument.

The advantage described above is obtained by the present invention described below.

A light emitting element according to one aspect of the invention includes an anode, a cathode, a hole transport layer disposed between the anode and the cathode and in the side of the anode, and a light emitting layer disposed between the anode and the cathode and in the side of the cathode, wherein the hole transport layer includes a first region disposed in the side of the anode and composed of a first organic polymer, and a second region disposed in the side of the light emitting layer and composed of a second organic polymer having a weight-average molecular weight different from the weight-average molecular weight of the first organic polymer.

According to this configuration, the light emitting element having superior emission efficiency can be obtained.

In the light emitting element according to another aspect of the invention, the weight-average molecular weight of the first organic polymer is preferably greater than the weight-average molecular weight of the second organic polymer.

According to this configuration, the light emitting element can be superior in both the emission efficiency and durability.

In the light emitting element according to another aspect of the invention, the weight-average molecular weight of the first organic polymer is preferably no less than 10000.

Thus, the first region can surely be in the amorphous condition, thus the anode and the light emitting layer can more surely be prevented or suppressed from short-circuiting to each other with time.

In the light emitting element according to another aspect of the invention, the weight-average molecular weight of the second organic polymer is preferably no greater than 8000.

By using the second organic polymer of such a small molecular weight, the orientation of the second region can further be enhanced, thus the hole transport efficiency in the second region can further be enhanced.

In the light emitting element according to another aspect of the invention, the first organic polymer and the second organic polymer are preferably the same kind.

Note here that the term "the same kind" includes the case in which the structures of the recurring units are the same.

According to this configuration, no interfacial surface is formed between the first region and the second region, or if any, the adhesiveness of the regions in the interfacial surface becomes extremely strong. As a result, the transportation of holes is performed more smoothly and surely throughout the hole transport layer.

In the light emitting element according to another aspect of the invention, the first and the second organic polymers are preferably one of polyarylamine, fluorene-arylamine copolymer, fluorene-bithiophene copolymer, and a derivative of one of polyarylamine, fluorene-arylamine copolymer, and fluorene-bithiophene copolymer.

By using such organic polymers having different molecular weights, materials having different characteristics can be prepared.

In the light emitting element according to another aspect of the invention, the first region of the hole transport layer preferably includes a function of one of preventing and suppressing a contact between the light emitting layer and the anode.

Accordingly, the short-circuit between the light emitting layer and the anode can be prevented or suppressed, thus preventing degradation of the emission efficiency and durability of the light emitting element.

In the light emitting element according to another aspect of the invention, the second region of the hole transport layer and the light emitting layer are preferably formed in a batch utilizing phase separation.

According to this configuration, the interface between them is substantially parallel to the upper surface of the anode in broad view, and in microscopic view the both layers are in an unevenly intricate (stacked) condition. Thus, the contact area between the light emitting layer and the hole transport layer becomes larger to enlarge the recombination site. And, since the recombination site resides in a position apart from the electrodes (the anode and the cathode), the site for emitting light is consequently enlarged (to increase the number of molecules contributing to light emission). Accordingly, improvement of the emission efficiency or further enhancement of the life of the light emitting element can be attempted.

In the light emitting element according to another aspect of the invention, the light emitting layer preferably includes polymeric light emitting material.

Accordingly, the phase separation can easily be controlled, thus the durability of the light emitting layer can be enhanced and the life of the light emitting element can be made longer.

In the light emitting element according to another aspect of the invention, the light emitting layer is preferably composed mainly of a mixture of an inorganic semiconductor material and a light emitting material.

Accordingly, the durability of the light emitting layer can further be enhanced and the life of the light emitting element can further be made longer.

In the light emitting element according to another aspect of the invention, at least a part of the inorganic semiconductor material is preferably plated with the light emitting material in the mixture.

Thus, the contact area between the hole transport layer and the light emitting material can further be increased, thus the site for emitting light can further be enlarged.

In the light emitting element according to another aspect of the invention, the inorganic semiconductor material is preferably composed mainly of a metal oxide.

The inorganic semiconductor materials composed mainly of metal oxides are preferable because they have high durability and superior electron transportation capacity.

In the light emitting element according to another aspect of the invention, the metal oxide is preferably composed principally of zirconium oxide.

The inorganic semiconductor materials composed mainly of zirconium oxide are preferable because they have particularly high durability and superior electron transportation capacity.

In the light emitting element according to another aspect of the invention, the inorganic semiconductor material is preferably formed like particles.

Thus, the contact area between the light emitting layer (the light emitting material) and the hole transport layer is enlarged, thus the advantage obtained by enlarging the contact area is notably exerted.

In the light emitting element according to another aspect of the invention, the average grain size of the inorganic semiconductor material is preferably in a range of 0.5 through 10 nm.

Thus, the contact area can sufficiently be provided between the light emitting layer and the hole transport layer.

In the light emitting element according to another aspect of the invention, the light emitting material is preferably composed mainly of a metal complex.

The light emitting materials composed mainly of metal complexes are preferable because they have high durability and superior emission efficiency.

In the light emitting element according to another aspect of the invention, the metal complex is preferably composed principally of a complex having iridium as a core metal.

The light emitting materials composed mainly of complexes (iridium complexes) having iridium as a core metal are preferable because they have high durability and high emission efficiency.

A display device according to still another aspect of the invention includes the light emitting element according to the above aspect of the invention.

Thus, the display device with high reliability can be obtained.

An electronic instrument according to still another aspect of the invention includes the display device according to the above aspect of the invention.

Thus, the electronic instrument with high reliability can be obtained.

BRIEF DESCRIPTION OF THE DRAWINGS

The invention will now be described with reference to the accompanying drawings, wherein like numbers refer to like elements.

DESCRIPTION OF THE EMBODIMENTS

Embodiments of a light emitting element, a display device and an electronic instrument according to the invention will hereinafter be described with reference to the accompanying drawings.

Figure 1:
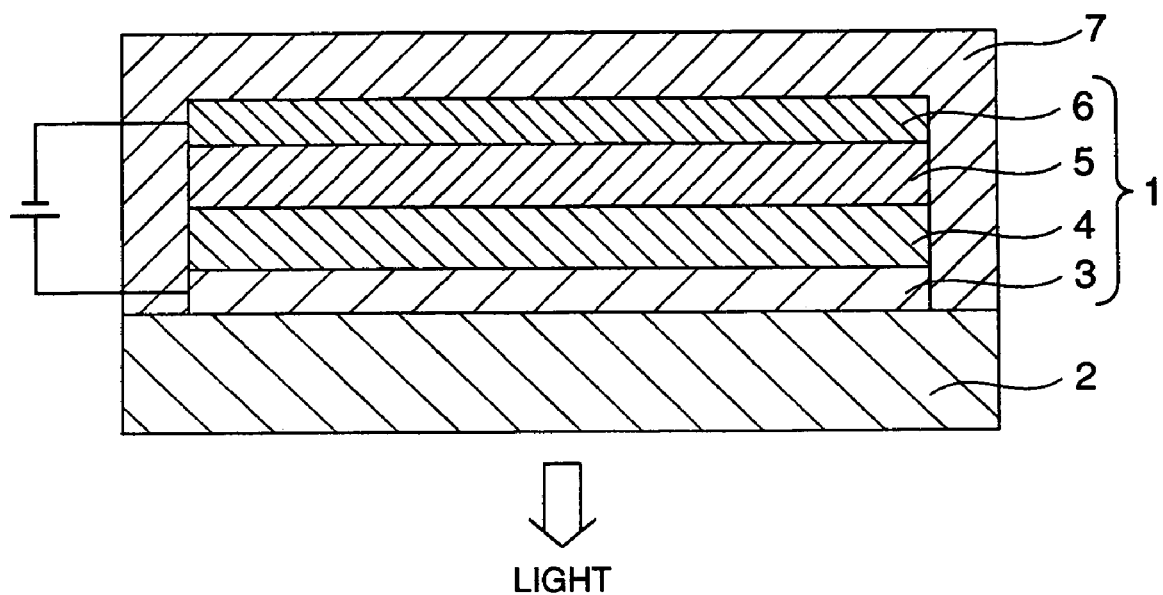
FIG. 1 is a cross-sectional view schematically showing a vertical cross-section of a light emitting element of an embodiment of the invention.
Figure 2:
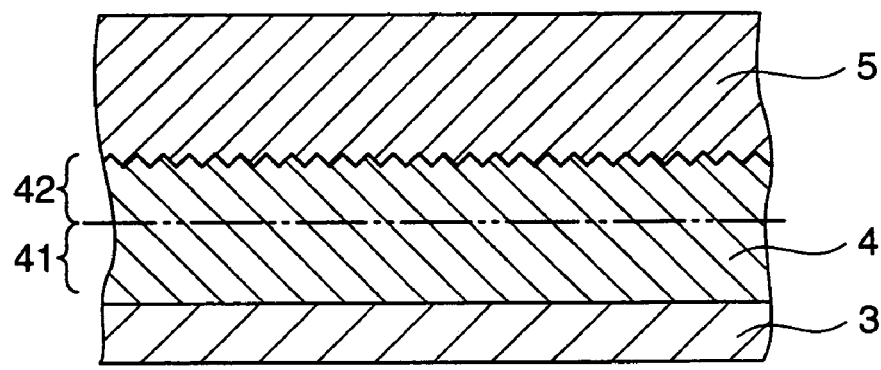
FIG. 2 is a cross-sectional view schematically showing the light emitting element shown in FIG. 1 in the vicinity of the interface between the hole transport layer and the light emitting layer.
Figure 3:
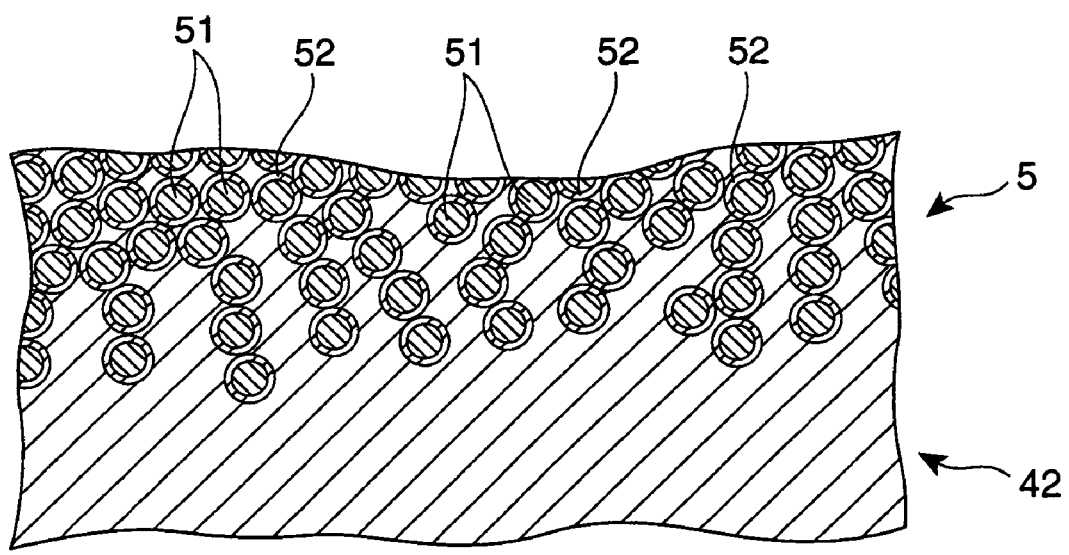
FIG. 3 is a further enlarged view of FIG. 2.

FIG. 1 is a cross-sectional view schematically showing a vertical cross-section of the light emitting element of the embodiment of the invention, FIG. 2 is a cross-sectional view of the light emitting element shown in FIG. 1 in the vicinity of the interface between the hole transport layer and the light emitting layer, and FIG. 3 is a further enlarged view of FIG. 2. Note that the descriptions will hereinafter be presented defining the upper side of FIGS. 1 through 3 as "upper side" and the lower side thereof as "lower side" for the sake of convenience of explanations.

The light emitting element (electroluminescence element) 1 is composed of an anode 3, a cathode 6, a hole transport layer 4 inserted between the anode 3 and the cathode 6 to be adjacent to the anode 3, and a light emitting layer 5 inserted between anode 3 and the cathode 6 to be adjacent to the cathode 6, and is provided on a substrate 2. Further, the anode 3, the hole transport layer 4, the light emitting layer 5, and the cathode 6 are sealed with a seal member 7.

The substrate 2 forms a support member of the light emitting element 1. Since the light emitting element 1 of the present embodiment has a structure (bottom emission type) of taking light from the substrate 2 side, the substrate 2 and the anode 3 are formed to be substantially transparent (transparent and colorless, transparent and colored, or translucent).

As a composing material of the substrate 2, for example, resin such as polyethylene terephthalate, polyethylene naphthalate, polypropylene, cycloolefin polymer, polyamide, polyethersulfone, polymethylmethacrylate, polycarbonate, or polyarylate, or glass materials such as quartz glass or soda glass can be cited, and these materials can be used alone or in combination.

The average thickness of such a substrate 2 is not particularly limited, but is preferably in a range of about 0.1 through 30 mm, and is further preferably in a range of about 0.1 through 10 mm.

Note that, if the light emitting element 1 has a structure (top-emission type) of taking light from the opposite side of the substrate 2, both of a transparent substrate and an opaque substrate can be used as the substrate 2.

As the opaque substrate, for example, a substrate composed of a ceramic material such as alumina, a substrate composed of a metal substrate made of, for example, stainless steel with oxide film (insulating film) formed on the surface thereof, and a substrate composed of a resin material can be cited.

The anode 3 is an electrode for injecting electric holes to the hole transport layer 4 described below. As the composing material of the anode 3, a material having large work function and superior in electrical conductivity is preferably used.

As a composing material of the anode 3, for example, ITO (indium tin oxide), IZO (indium zinc oxide), $In_2O_3$, $SnO_2$, Sb-doped $SnO_2$ ($SnO_2$:Sb), an oxide of Al-doped ZnO (ZnO: Al), Au, Pt, Ag, Cu, or alloys including these metals can be cited, and can be used alone or in combination.

The average thickness of the anode 3 is not particularly limited, but is preferably in a range of about 10 through 200 nm, and is further preferably in a range of about 50 through 150 nm.

In contrast, the cathode 6 is an electrode for injecting electrons to the light emitting layer 5 described below. As a composing material of the cathode 6, a material having small work function is preferably used.

As the composing material of the cathode 6, for example, Li, Mg, Ca, Sr, La, Ce, Er, Eu, Sc, Y, Yb, Ag, Cu, Al, Cs, Rb, or alloys including these metals can be cited, and can be used alone or in combination (e.g., multi-layered stacked structure or the like).

Particularly, if an alloy is used as the composing material, the alloy including a stable metallic element such as Ag, Al, Cu, specifically MgAg, AlLi, CuLi or the like is preferably used. By using such an alloy as the composing material of the cathode 6, the electron injection efficiency and stability of the cathode 6 can be enhanced.

The average thickness of the cathode 6 is not particularly limited, but is preferably in a range of about 100 through 10000 nm, and is further preferably in a range of about 200 through 500 nm.

Note that, since the light emitting element 1 of the present embodiment is the bottom emission type, translucency is not particularly required to the cathode 6.

The hole transport layer 4 has a function of transporting holes injected from the anode 3 to the light emitting layer 5. The hole transport layer 4 is mainly composed of organic polymer.

Further, as shown in FIG. 2, the hole transport layer 4 of the present embodiment includes a first region 41 for making contact with the anode 3 and a second region 42 for making contact with the light emitting layer 5. And, the present embodiment of the invention has a feature in forming the first and the second regions 41, 42 with a first organic polymer and a second organic polymer having a weight-average molecular weight different from that of the first organic polymer, respectively.

In this case, for example, by using the first organic polymer having a larger weight-average molecular weight than that of the second organic polymer, the following advantages can be obtained.

That is, if the hole transport layer is formed only with the second organic polymer (to form only the second region 42) without using the first organic polymer, the organic polymer having a relatively low molecular weight inferior in orientation and easy to be crystallized causes high carrier mobility but a polycrystalline condition, thus holes (carriers) easily move in the grain boundaries (boundaries between the crystal grains) in the hole transport layer making short circuit occur easily. The extent shows a tendency of increasing with time.

As a result, the condition in which the anode and the cathode is short-circuited is created, thus disturbing to obtain superior durability in the light emitting elements.

On the contrary, by providing the first region 41 composed of the first organic polymer having a relatively high molecular weight between the anode 3 and the second region 42, the first region 41 becomes an amorphous condition to prevent generation of the crystal grains which may cause the problem mentioned above, and therefore, even if the second region 42 is in the polycrystalline condition, it can be prevented or suppressed that the anode 3 and the light emitting layer 5 are short-circuited. As a result, durability of the light emitting element 1 can be enhanced (to have a longer life).

Further, since the second region 42 is superior in orientation as described above, the movement (transportation) of holes is executed quickly thus enhancing the emission efficiency of the light emitting element 1.

As described above, according to the synergistic effect of providing the first region 41 and the second region 42, the light emitting element 1 becomes superior in both emission efficiency and durability.

In particular, by selecting a material with superior hole injection efficiency as the first organic polymer, holes can effectively be injected from the anode 3 to the second region 42 via the first region 41, and the injected holes can efficiently be transported through the second region 42, thus the emission efficiency of the light emitting element 1 can further be enhanced.

In this case, the weight-average molecular weight of the first organic polymer is preferably no less than 10000, and further preferably in a range of about 15000 through 50000. Thus, the first region 41 can surely be in the amorphous condition, thus the anode 3 and the light emitting layer 5 can more surely be prevented or suppressed from short-circuiting to each other with time.

In contrast, the weight-average molecular weight of the second organic polymer is preferably no larger than 8000, and further preferably in a range of about 1500 through 5000. By using the second organic polymer of such a small molecular weight, the orientation of the second region 42 can further be enhanced, thus the hole transport efficiency in the second region 42 can further be enhanced. Further, by using the second organic polymer of such a small molecular weight, the second region 42 and the light emitting layer 5 can further surely be formed if they are formed in a batch using phase separation technology described below.

Further, for example, by using the first organic polymer having a smaller weight-average molecular weight than that of the second organic polymer, the following advantages can be obtained.

Namely, the first organic polymer having a relatively small molecular weight has a large band gap compared to the second organic polymer having a relatively large molecular weight. Therefore, by disposing the first region 41 made of the first organic polymer in the side of the anode 3 and the second region 42 made of the second organic polymer in the side of the light emitting layer 5, holes can efficiently be moved from the anode 3 toward the light emitting layer 5 in a cascade manner (smoothly), namely, the holes can efficiently be transported through the hole transport layer 4. As a result, the light emitting element 1 can further be improved in the emission efficiency.

Further, as described below, the second region 42 of the hole transport layer 4 and the light emitting layer 5 are preferably formed in a batch using the phase separation (vertical phase separation) technology. In this case, if a part of the light emitting layer 5 is formed through the hole transport layer 4, the presence of the second region 42 can prevent or suppress the light emitting layer 5 and the anode 3 from making contact to each other. In other words, the second region 42 can be made function as a barrier layer for preventing or suppressing the second region 42 of the hole transport layer 4 and light emitting layer 5 from making contact to each other. Accordingly, the short-circuit between the light emitting layer 5 and the anode 3 can be prevented or suppressed, thus preventing degradation of the emission efficiency and durability of the light emitting element 1.

As the first organic polymer and the second organic polymer, various kinds of p-type semiconductor materials are respectively used, and for example, polyarylamine, fluorene-arylamine copolymer, fluorene-bithiophene copolymer, poly (N-vinylcarbazole), polyvinylpyrene, polyvinylanthracene, polythiophene, polyalkylthiophene, polyhexylthiophene, poly(p-phenylenevinylene), polythenylenevinylene, pyrene-formaldehyde resin, ethylcarbazole-formaldehyde resin, or derivatives of the above can be cited, and can be used alone or in combination.

In the above materials, as one example of the polyarylamine derivatives, triphenylamine polymer shown in Chemical Formula 1 can be cited.

[Chemical Formula 1]

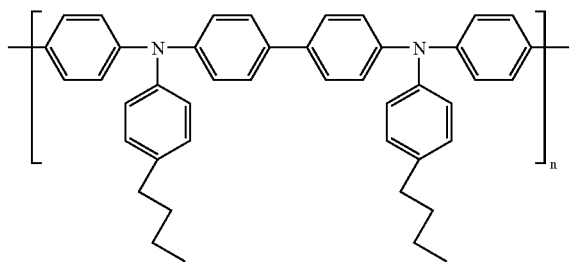

Further, the chemical compound can also be used as a mixture with other chemical conpounds. As an example, poly (3,4-ethylenedioxythiophene/styrenesulfonate) (PEDOT/PSS) or the like can be cited as the mixture containing polythiophene.

Although the first organic polymer and the second organic polymer can be of different kinds, they are preferably of the same kind. Thus, no interface is formed between the first region 41 and the second region 42, or if formed, the adhesiveness of the regions 41, 42 in the interface becomes extremely strong. As a result, transportation of holes can be preformed throughout the hole transport layer 4 further smoothly and further surely.

In this case, as the first organic polymer and the second organic polymer, polyarylamine, fluorene-arylamine copolymer, fluorene-bithiophene copolymer, or derivatives thereof is preferably used especially in the materials described above. By using such organic polymers having different molecular weights, materials having different characteristics as described above can be prepared.

The average thickness of the hole transport layer 4 (the total thickness of the first region 41 and the second region 42) is not particularly limited, but is preferably in a rage of about 10 through 150 nm, and further preferably in a rage of about 50 through 100 nm.

Note that, for example, between the first region 41 and the second region 42, between the first region 41 and the anode 3, or the like, there can be formed one or more regions for any purposes.

The light emitting layer 5 is provided adjacent to the hole transport layer 4 (the second region 42) so as to make contact therewith. The light emitting layer 5 transports the electrons injected from the cathode 6 and receives the holes from the hole transport layer 4. And, the holes and the electrons are recombined in the vicinity of the interface with the hole transport layer 4 to generate excitons by the energy discharged upon the recombination, the excitons then discharge (emit) the energy (fluorescence or phosphorescence) upon returning to the ground state.

The light emitting layer 5 and the hole transport layer 4 are disposed so that the interface between them is substantially parallel to the upper surface of the anode 3 in broad view as shown in FIG. 2, and in microscopic view the both layers are in an unevenly intricate (stacked) condition as shown in FIG. 3.

Thus, the contact area between the light emitting layer 5 and the hole transport layer 4 becomes larger to enlarge the recombination site. And, since the recombination site resides in a position apart from the electrodes (the anode 3 and the cathode 6), the site for emitting light is consequently enlarged (to increase the number of molecules contributing to light emission). Accordingly, improvement of the emission efficiency or further enhancement of the life of the light emitting element 1 can be attempted.

Further, since the interface between the light emitting layer 5 and the hole transport layer 4 is not uniform (even) and has an uneven shape, the holes and the electrons can be prevented from concurrently excited and combined even if the drive voltage value rises, thus the light emission intensity can be prevented from rising steeply. Accordingly, since the intensity can be raised gently in accordance with the drive voltage value, control of the emission intensity or control of grayscale of the light emitting element 1 can easily be performed. Further, an advantage is obtained that the complicated peripheral circuit for precisely controlling the drive voltage can be eliminated.

Such an interface can easily be obtained by forming the light emitting layer 5 and the second region 42 of the hole transport layer 4 in a batch using the phase separation (vertical phase separation) technology as described below.

The light emitting layer 5 of the present embodiment is mainly composed of a complex of inorganic semiconductor particles (particulate inorganic semiconductor material) 51 and a light emitting material 52. In the configuration shown in the drawings, the light emitting material 52 covers the whole of the inorganic semiconductor particles 51, but can be configured to cover only a part of the inorganic semiconductor particles 51. As described above, by covering the surface of the inorganic semiconductor particles 51 with the light emitting material 52, the contact area between the hole transport layer 4 and the light emitting material 52 is further enlarged, thus the site for emitting light can further be enlarged.

In such a light emitting layer 5, the light emitting material 52 is provided with electrons via the inorganic semiconductor particles 51, thus the light emitting material 52 emits light. In other words, the aggregation (collective entity) of the inorganic semiconductor particles 51 can be called as an electron transport layer.

As described above, by using the inorganic semiconductor material as the composing material of the light emitting layer 5, durability of the light emitting layer 5 can further be enhanced, and further enhanced life of the light emitting element 1 can be intended.

As such an inorganic semiconductor material, for example, a metal oxide such as $ZrO_2$, $TiO_2$, $TiO$, $Ti_2O_3$, $NbO$, $SrTiO_3$, $ZnO$, $SiO_2$, $Al_2O_3$ or $SnO_2$, a metal sulfide such as $ZnS$ or CdS, a metal selenide such as CdSe, a metal carbide or a semiconductor carbide such as TiC or SiC, a semiconductor nitride such as $Si_3N_4$, $B_4N$ or BN, or the like can be cited, and can be used alone or in combination (e.g., in a form of mixture or solid dispersion).

Among the above, as the inorganic semiconductor material, the materials composed mainly of metal oxides are preferable, and the materials composed primarily of $ZnO_2$ (zirconia) are particularly preferable among the metal oxides. The inorganic semiconductor materials composed mainly of metal oxides (particularly $ZnO_2$) are preferable because they have high durability and superior electron transportation capacity.

Further, by forming the inorganic semiconductor material as particles as in the present embodiment, the contact area between the light emitting layer 5 (the light emitting material 52) and the hole transport layer 4 is enlarged, thus the advantage obtained by enlarging the contact area described above is notably exerted.

In this case, each grain of the inorganic semiconductor particles (the particulate inorganic semiconductor material) 51 preferably has a diameter in a range of about 0.5 through 10 nm, and further preferably in a range of about 1 through 7 nm. Thus, the contact area can sufficiently be provided between the light emitting layer 5 and the hole transport layer 4, thus the advantage described above can further be enhanced.

Further, as the light emitting material 52, for example, various metal complexes such as a three-coordinate iridium complex having 2,2'-bipyridine-4,4'-dicarboxylic acid shown in Chemical Formula 2 as a ligand, fac-tris (2-phenylpyridine) iridium (Ir (ppy)$_2$), 8-hydroxyquinoline aluminum (Alq$_2$), tris (4-methyl-8 quinolinolate) aluminum (III) (Almq$_2$), 8-hydroxyquinoline zinc (Znq$_2$), (1,10-phenanthroline)-tris-(4,4,4-trifluoro-1-(2-chenyl)-butane-1,3-dionate) europium (III) (Eu (TTA)$_2$(phen)) or 2,3,7,8,12,13,17,18-octaethyl-21H,23H-porphin platinum (II), a benzene compound such as distyrylbenzene (DSB) or diamino-distyrylbenzene (DADSB), a naphthalene compound such as naphthalene or nailered, a phenanthrene compound such as phenanthrene, a chrysene compound such as chrysene or 6-nitrochrysene, a perylene compound such as perylene, N,N'-bis (2,5-di-t-buthylphenyl)-3,4,9,10-perylene-di-carboxyimide (BPPC), a coronene compound such as coronene, a anthracene compound such as anthracene or bis(styryl) anthracene, a pyrene compound such as pyrene, a pyran compound such as 4-(di-cyanomethylene)-2-methyl-6-(para-dimethylaminostyryl)-4H-pyran (DCM), an acridine compound such as acridine, a stilbene compound such as stilbene, a thiophene compound such as 2,5-dibenzooxazolethiophene, a benzooxazole compound such as benzooxazole, a benzoimidazole compound such as benzoimidazole, a benzothiazole compound such as 2,2'-(para-phenylenedivinylene)-bisbenzothiazole, a butadiene compound such as bistyryl (1,4-diphenyl-1,3-butadiene) or tetraphenylbutadiene, a naphthalimide compound such as naphthalimide, a coumarin compound such as coumarin, perynone compound such as perynone, a oxadiazole compound such as oxadiazole, an aldazine compound, a cyclopentadiene compound such as 1,2,3,4,5-pentaphenyl-1,3-cyclopentadiene (PPCP), a quinacridone compound such as quinacridone or quinacridone red, a pyridine compound such as pyrrolopyridine or thiadiazolopyridine, a spiro compound such as 2,2',7,7'-tetraphenyl-9,9'-spirobifluorene, a metal or metal-free phthalocyanine compound such as phthalocyanine (H2Pc) or copper phthalocyanine, or a fluorene compound such as fluorene can be cited, and can be used alone or in combination.

[Chemical Formula 2]

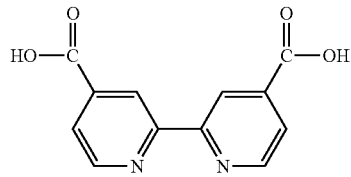

Among these materials, as the light emitting material 52, the materials composed mainly of metal complexes are preferable, and the materials composed principally of the complexes (iridium complexes) having iridium as the core metal are further preferable. The light emitting materials 52 composed mainly of metal complexes (in particular iridium complexes) are preferable because they have high durability and high emission efficiency.

The average thickness of the light emitting layer 5 is not particularly limited, but is preferably in a range of about 1 through 100 nm, and is further preferably in a range of about 20 through 50 nm.

Note that an organic semiconductor material can be used for the light emitting layer 5 as the material for contributing to electron transportation instead of the inorganic semiconductor material, and further, the light emitting layer 5 can be composed mainly of the light emitting material (the small molecular light emitting material) 52 described above while omitting the material contributing to electron transportation.

Further, the light emitting layer 5 can be composed principally of a polymeric light emitting material. In this case, by appropriately selecting the light emitting material and the second organic polymer, the light emitting layer 5 and the hole transport layer 4 can also be formed in a batch using the phase separation technology described below. Further, the phase separation can easily be controlled, thus the durability of the light emitting layer 5 can be enhanced and the life of the light emitting element 1 can be made longer. In this case, for example, a material having a weight-average molecular weight smaller than that of the light emitting material is preferably selected as the second organic polymer.

As the polymeric light emitting material, for example, a polyacetylene compound such as trans-polyacetylene, cis-polyacetylene, poly(diphenylacetylene) (PDPA), poly(alkyl, phenylacetylene) (PAPA), polyparaphenylenevinylene compound such as poly(para-phenevinylene) (PPV), poly(2,5-dialkoxy-para-phenylenevinylene) (RO-PPV), cyano-substituted poly(para-phenylenevinylene) (CN-PPV), poly(2-dimethyloctylsilyl-para-phenylenevinylene) (DMOS-PPV) or poly(2-methoxy,5-(2'-ethylhexoxy)-para-phenylenevinylene) (MEH-PPV), a polythiophene compound such as poly(3-alkylthiophene) (PAT), poly(oxypropylene) triol (POPT), a polyfluorene compound such as poly(9,9-dialkylfluorene) (PDAF), poly(dioctylfluorene-alt-benzothiadiazole) (F8BT), α,ω-bis[N,N'-di(methylphenyl) aminophenyl]-poly [9,9-bis(2-ethylhexyl) fluorene-2,7-diyl](PF2/6am4) or poly(9,9-dioctyl-2,7-divinylenefluorenyl-alt-co(anthracene-9,10-diyl)), a polyparaphenylene compound such as poly (para-phenylene) (PPP) or poly(1,5-dialkoxy-para-phenylene) (RO-PPP), a polycarbazole compound such as poly (N-vinylcarbazole), or a polysilane compound such as poly (methylphenylsilane) (PMPS), poly(naphthylphenylsilane) (PNPS) or poly(biphenylylphenylsilane) (PBPS) can be cited.

The seal member 7 is provided so as to cover the anode 3, the hole transport layer 4, the light emitting layer 5 and the cathode 6, and has a function of sealing these components air-tightly for blocking oxygen and moisture. By providing the seal member 7, an advantage of enhancing the reliability of the light emitting element 1 or preventing deterioration or degradation (i.e., enhancement of durability) of the light emitting element 1 can be obtained.

As a composing material of the seal member 7, for example, Al, Au, Cr, Nb, Ta, Ti or alloys including these metals, oxide silicon, or various resin materials can be cited. Note that if a conductive material is used as the composing material of the sealing member 7, an insulating film is preferably provided in each of the interfaces of the sealing member 7 with the anode 3, the hole transport layer 4, the light emitting layer 5 and the cathode 6 in order for preventing short-circuit if necessary.

Further, the seal member 7 can be formed as a plain plate facing the substrate 2 with a gap to be filled with a seal material such as thermoset resin or the like.

The light emitting element 1 described above can be manufactured as follows, for example.

Firstly, the substrate 2 is provided, and then the anode 3 is formed on the substrate 2.

The anode 3 can be formed using, for example, a chemical vapor deposition (CVD) process such as a plasma CVD process, a thermal CVD process or a laser CVD process, a dry plating process such as a vacuum deposition process, a sputtering process or a ion plating process, a wet plating process such as an electrolytic plating process, an immersion plating process or an electroless plating process, a thermal spraying process, a sol-gel process, or a MOD process, or by bonding a metal foil.

Subsequently, the first region 41 of the hole transport layer 4 is formed on the anode 3.

The first region 41 can be formed by, for example, supplying the anode 3 with a first region forming material obtained by dissolving the first organic polymer in a solvent or by dispersing the first organic polymer in dispersion medium.

As a method of supplying the first region forming material, for example, a spin coating method, a casting method, a micro gravure coating method, a gravure coating method, a bar coating method, a roller coating method, a wire bar coating method, a dip coating method, a spray coating method, a screen printing method, a flexographic printing method, an offset printing method, an inkjet printing method, and so on can be used. According to these coating methods, the first region 41 can be formed with relative ease.

As the solvent for dissolving the first organic polymer or the dispersion medium for dispersing the first organic polymer, for example, an inorganic solvent such as nitric acid, sulfuric acid, ammonia, hydrogen peroxide, water, carbon disulfide, carbon tetrachloride, or ethylene carbonate, various organic solvents including ketones such as methyl ethyl ketone (MEK), acetone, diethyl ketone, methyl isopropyl ketone (MIPK), or cyclohexanon, an alcohols solvent such as methanol, ethanol, isopropanol, ethylene glycol, diethylene glycol (DEG), or glycerine, ethers such as diethyl ether, diisopropyl ether, 1,2-dimetoxy ethane (DME), 1,4-dioxane, tetrahydrofuran (THF), tetrahydropyran (THP), anisole, diethylene glycol dimethyl ether (diglyme), or diethylene glycol ethyl ether (carbitol), a cellosolve™ solvent such as methyl cellosolve, ethyl cellosolve, or phenyl cellosolve, an aliphatic hydrocarbons solvent such as hexane, pentane, heptane, or cyclohexane, an aromatic hydrocarbons solvent such as toluene, xylene, or benzene, a heteroaromatic solvent such as pyridine, pyrazine, furan, pyrrole, thiophene, or methylpyrrolidone, an amide solvent such as N,N-dimethylformamide (DMF) or N,N-dimethylacetamide (DMA), a halogenated compound solvent such as chlorobenzene, dichloromethane, chloroform, or 1,2-dichloroethane, an esters solvent such as ethyl acetate, methyl acetate, or ethyl formate, a sulfur compound solvent such as dimethyl sulfoxide (DMSO) or sulfolane, a nitrile solvent such as acetonitrile, propionitrile, or acrylonitrile, an organic acids solvent such as formic acid, acetic acid, trichloroacetic acid, or trifluoroacetic acid, or a mixed solvent including the above can be cited.

Note that, if a material with a relatively molecular weight is used as the first organic polymer, a solvent of high solubility such as, for example, a halogenated compound solvent (in particular, a halogenated aromatic hydrocarbons solvent) is preferably used as the solvent for dissolving the first organic polymer.

A drying process (for removing the solvent of the dispersion medium) can be executed on the resulted liquid film if necessary. The drying process can be carried out by, for example, leaving in an environment of atmospheric pressure or reduced-pressure, a heating process or blowing with an inactive gas.

By executing the above operation once or a number of times, the first region 41 with a desired thickness can be formed.

Note that, prior to the present step, an oxygen plasma process can be executed on the upper surface of the anode 3. According to this process, the upper surface of the anode 3 can be provided with lyophilicity, any organic substances adhered to the upper surface of the anode 3 can be removed (washed out), and the work function around the upper surface of the anode 3 can be adjusted.

In this case, in the conditions of the $O_2$ plasma process, for example, the plasma power is preferably in a range of about 100 through 800 W, the flow rate of the oxygen gas is preferably in a range of about 50 through 100 mL/min, the transportation velocity of the processed member (the anode 3) is preferably in a range of about 0.5 through 10 mm/sec, and the temperature of the processed member is preferably in a range of about 70 through 90° C.

Note that by using a different kind of material from the second organic polymer for the first organic polymer, the first region 41 can be formed simultaneously with the second region 42 and the light emitting layer 5 in the following step [3] using the phase separation method.

Subsequently, the second region 42 and the light emitting layer 5 are formed on the first region 41 in a batch. The step can be executed as follows.

Firstly, the second organic polymer is dissolved in the solvent, and then the mixture of the inorganic semiconductor particles 51 and the light emitting material 52 is dispersed in the solution to confect the liquid material.

As the solvent, a nonpolar solvent is preferable, and for example, an aromatic carbon hydride solvent such as xylene, toluene, cyclohexylbenzene, dihydrobenzene, trimethylbenzene or tetramethylbenzene, a heteroaromatic solvent such as pyridine, pyrazine, furan, pyrrole, thiophene or methylpyrrolidone, or an aliphatic hydrocarbons solvent such as hexane, pentane, heptane or cyclohexane can be cited, and can be used alone or in combination.

Subsequently, this liquid material is provided on the second region 42 using the coating method described above to form the liquid film.

And then, the solvent is removed from the liquid film. After the solvent is removed, the second organic polymer and the mixture are separated in the liquid film in the vertical direction and solidified to form the second region 42 and the light emitting layer 5. In other words, the second region 42 and the light emitting layer 5 are formed in a batch using the phase separation method.

In this case, the phase separation condition of the second organic polymer and the mixture can be controlled by properly setting at least one of the conditions, namely a kind of the solvent, the weight-average molecular weight of the second organic polymer, the content of the second organic polymer in the liquid material, the content of the mixture (the composing material of the light emitting layer 5) in the liquid material, the rate of removing the solvent, the condition of the ambient in which the solvent is removed, the property of the surface on which the liquid material is provided, and so on.

For example, the ambient in which the solvent is removed can be arranged to include vapor of a polar solvent. Thus, the mixture can more surely be collected in the upper portion of the liquid film. Note that as such a polar solvent, for example, water or alcohols such as methanol, ethanol or isopropanol can be cited.

Further, if the same kind of materials are used as the first organic polymer and the second organic polymer as in the present embodiment, an advantage is obtained that the second organic polymer can more surely be collected in the lower portion (the side of the first region 41) of the liquid film utilizing the affinity thereof.

Subsequently, the cathode 6 is formed on the light emitting layer 5.

The cathode 6 can be formed using, for example, a vacuum deposition process, a sputtering process, or a process of bonding a metal foil.

Subsequently, the seal member 7 is provided so as to cover the anode 3, the hole transport layer 4, the light emitting layer 5 and the cathode 6 and is bonded with the substrate 2.

The light emitting element 1 is thus manufactured through the processes described above.

Further, the light emitting element 1 described above can be provided with a layer of any purposes in at least one of the interfaces between the anode 3 and the hole transport layer 4, between the hole transport layer 4 and the light emitting layer 5, and between the light emitting layer 5 and the cathode 6.

For example, an intermediate layer having a function of facilitating electron injection to the light emitting layer 5 can be provided between the light emitting layer 5 and the cathode 6. By providing the present intermediate layer, the emission efficiency of the light emitting element 1 can further be enhanced. Note that the intermediate layer can alternatively be made function to prevent or suppress the contact between the hole transport layer 4 and the cathode 6.

The intermediate layer is preferably composed of a material having an energy level (bottom potential) of the conduction band higher than that of the composing material (an inorganic semiconductor in the present embodiment) of the light emitting layer 5. By thus arranged, electrons can be moved from the cathode 6 toward the light emitting layer 5 (the light emitting material) in a cascade manner (smoothly), namely, the electrons can efficiently be injected (transported) to the light emitting layer 5. As a result, the light emitting element 1 can further be improved in the emission efficiency.

A material forming the intermediate layer described above is not particularly limited and any materials satisfying the conditions described above can be adopted, and for example, an organic or inorganic semiconductor material alone, or a mixture of an organic or inorganic semiconductor material and a chemical compound including electron absorption group can be used.

Note that, if particulates (semiconductor material particles) are used as the semiconductor material, the semiconductor material particles at least partially plated (modified) with a chemical compound having an electron absorption group is preferably used as the mixture described above.

And, by selecting the kind of the compound having the electron absorption group, the energy level of the conduction band of the semiconductor material can be adjusted.

As the compound having the electron absorption group, for example, a fluorocarbon silane coupling compound such as $CF_3(CF_2)_7(CH_2)_2(CH_3)_2Si(CH_2)_3SiCl_3$:F17, $CF_3(CF_2)_3(CH_2)_2(CH_3)_2Si(CH_2)_9SiCl_3$:F9 or $CF_3(CF_2)_2(CH_3)_2Si(CH_2)_{12}SiCl_3$:F3 can preferably be used.

As a method of combining (plating) such a compound with (on) the semiconductor material, for example, a process in which the compound is vaporized and then the semiconductor material is exposed to the vapor (a vapor phase process), a process in which the semiconductor material is made contact with a liquid containing the compound (a liquid phase process), and so on can be cited.

The average thickness of the intermediate layer is preferably in a range of about 1 through 50 nm, and further preferably in a range of about 5 through 30 nm.

The light emitting element 1 described above can be used as, for example, a light source. Further, by disposing a number of light emitting elements 1 in a matrix, a display device (an embodiment of the invention) can be composed.

Note that a drive system for the display is not particularly limited, and either the active matrix system or the passive matrix system can be adopted.

Hereinafter, an embodiment of a display device according to the invention will be described.

Figure 4:
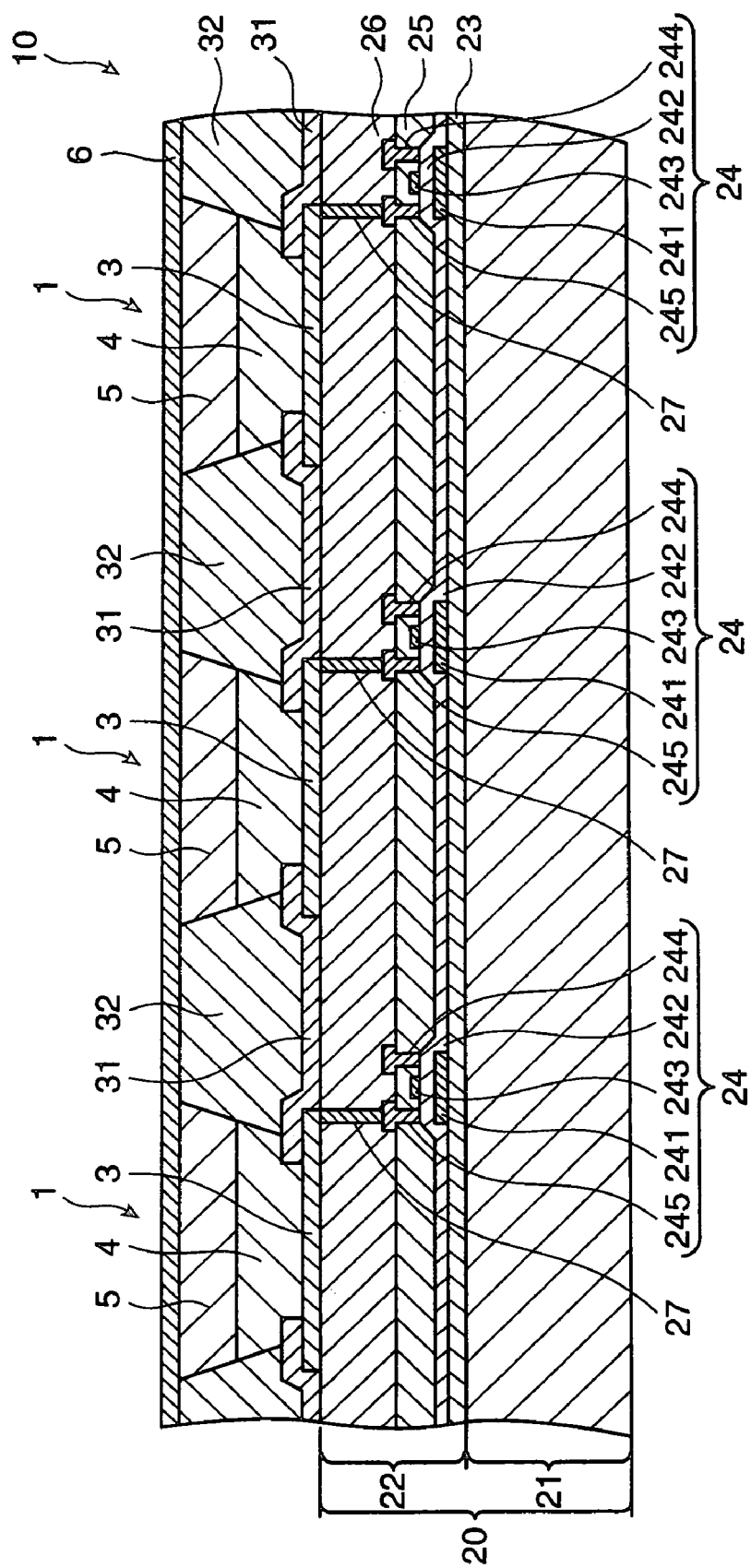
FIG. 4 is a vertical cross-sectional view of an embodiment of a display device according to the invention.

FIG. 4 is a vertical cross-sectional view of an embodiment of a display device according to the invention.

The display device 10 shown in FIG. 4 is composed of a base body 20 and a number of light emitting element 1 provided on the base body 20.

The base body 20 includes a substrate 21 and a circuit section 22 formed on the substrate 21.

The circuit section 22 includes a protective layer 23 formed of, for example, an oxide silicon layer, driving TFTs (switching elements) 24 formed on the protective layer 23, a first interlayer insulating layer 25 and a second interlayer insulating layer 26.

The driving TFT 24 includes a semiconductor layer 241 made of silicon, a gate insulating layer 242 formed on the semiconductor layer 241, a gate electrode 243 formed on the gate insulating layer 242, a source electrode 244, and a drain electrode 245.

The light emitting element 1 is provided on the circuit section 22 correspondingly to each of the driving TFTs 24. Further, each of the light emitting elements 1 is partitioned from the adjacent ones of the light emitting elements 1 by a first partition wall section 31 and a second partition wall section 32.

In the present embodiment, the anode 3 of each of the light emitting elements 1 forms a pixel electrode, and is connected to the drain electrode 245 of respective one of the driving TFTs 24 via wiring 27. Further, the cathode 6 of each of the light emitting elements 1 is used as the common electrode.

And, the seal member (not shown) is bonded with the base body 20 so as to cover the every light emitting element 1, thus sealing the every light emitting element 1.

The display device 10 can be a monochrome display, but can display color images by properly selecting the light emitting material for each of the light emitting elements 1.

The display device 10 (the display device according to the invention) described above can be implemented in various types of electronic instruments.

Figure 5:
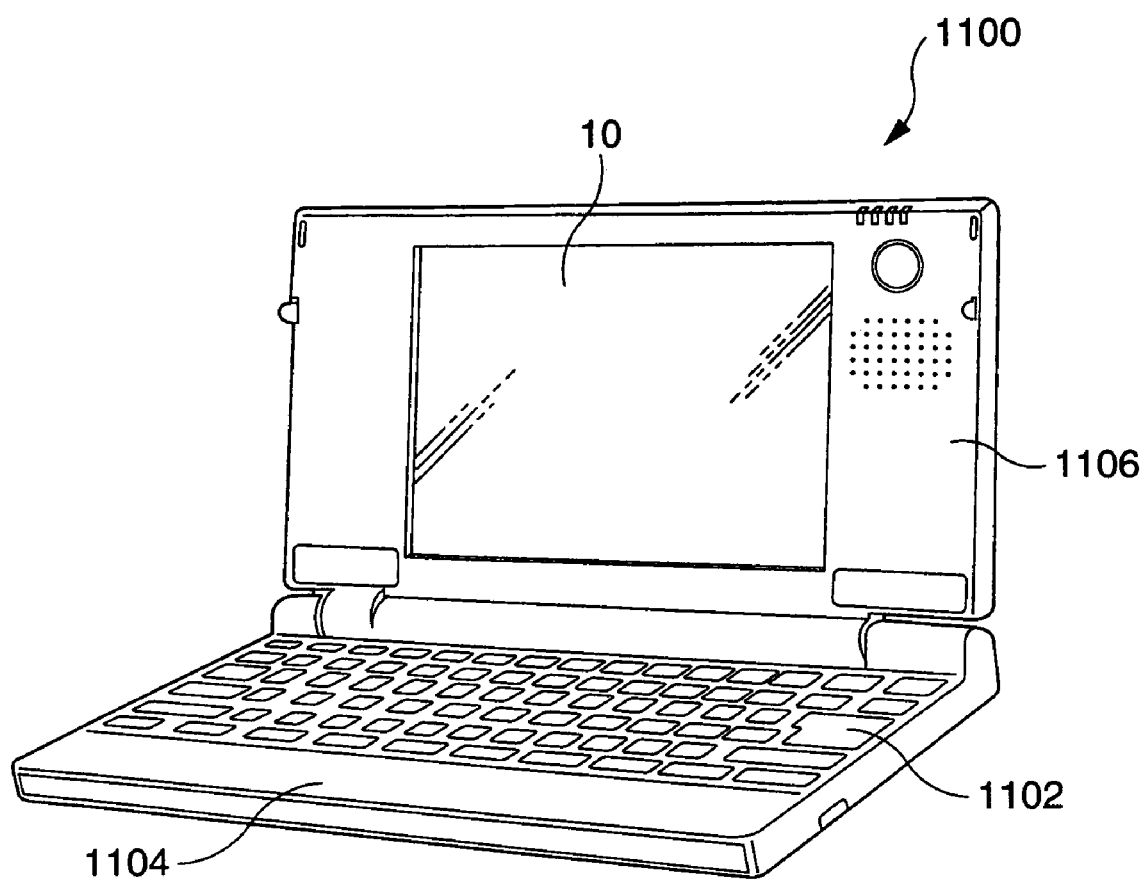
FIG. 5 is a perspective view showing a configuration of a mobile type (or laptop type) of personal computer as an embodiment of an electronic instrument according to the invention.

FIG. 5 is a perspective view showing a configuration of a mobile type (or laptop type) of personal computer as an embodiment of an electronic instrument according to the invention.

In the drawing, a personal computer 1100 is composed of a main body section 1104 equipped with a keyboard 1102 and a display unit 1106 equipped with a display section, and the display unit 1106 is pivotally supported with respect to the main body section 1104 via a hinge structure.

In the personal computer 1100, the display section implemented in the display unit 1106 is composed of the display device 10 described above.

Figure 6:
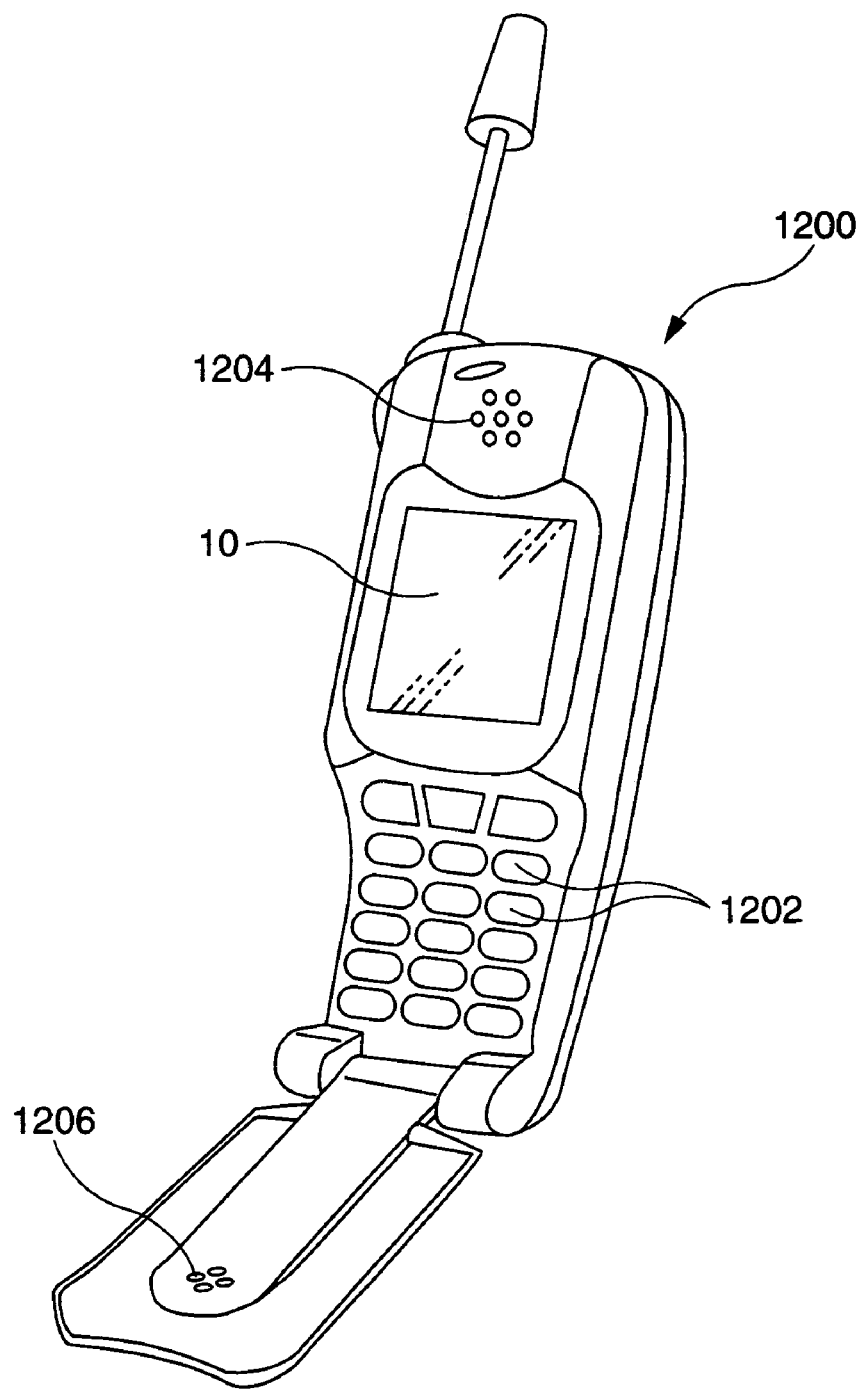
FIG. 6 is a perspective view showing a configuration of a cellular phone (including PHS) as an embodiment of the electronic instrument according to the invention.

FIG. 6 is a perspective view showing a configuration of a cellular phone (including PHS) as an embodiment of the electronic instrument according to the invention.

In this drawing, the cellular phone 1200 is equipped with a display section in addition to a plurality of operation buttons 1202, an ear piece 1204 and a mouthpiece 1206.

In this cellular phone 1200, the display section is composed of the display device 10 described above.

Figure 7:
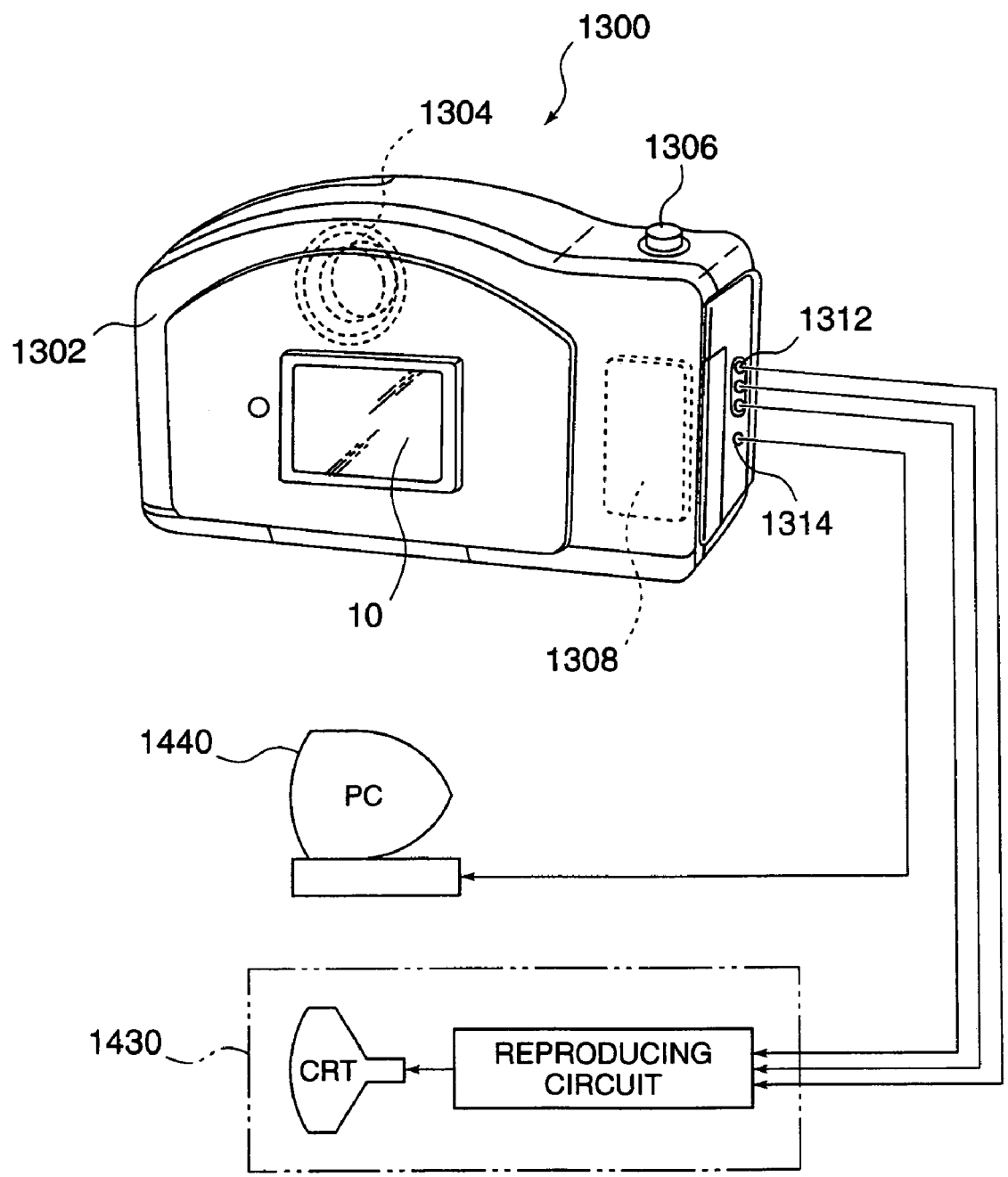
FIG. 7 is a perspective view showing a configuration of a digital still camera as an embodiment of the electronic instrument according to the invention.

FIG. 7 is a perspective view showing a configuration of a digital still camera as an embodiment of the electronic instrument according to the invention. Note that connection with external equipment is schematically shown in this drawing.

Note also that conventional cameras expose silver salt films to optical images of objects on the one hand, the digital still camera 1300 performs photoelectric conversion of optical images of objects by image capture elements such as CCD (charge coupled device) to generate imaging signals (image signals), on the other hand.

The case (body) 1302 of the digital still camera 1300 is equipped with a display section on the back surface thereof to be configured to display images in accordance with the imaging signal from the CCD, where the display section functions as a viewfinder for displaying electronic images of objects.

In the digital still camera 1300, the display section is composed of the display device 10 described above.

Inside the case, there is installed a circuit board 1308. The circuit board 1308 is equipped with a memory device capable of storing (recording) the imaging signals.

Further, the front surface (the back side in the drawing) of the case 1302 is provided with an optical sensing unit 1304 including optical lenses (an optical imaging system) and the CCD.

When a photographer confirms an object image displayed on the display section, and then pushes a shutter button 1306 down, the imaging signal from the CCD at that moment is transferred to and stored in the memory device of the circuit board 1308.

Further, the digital still camera 1300 is provided with video signal output terminals 1312 and an input-output terminal 1314 for data communication on a side surface of the case 1302. And, as shown in the drawing, a television monitor 1430 and a personal computer 1440 are respectively connected to the video signal output terminals 1312 and the input-output terminal 1314 for data communication according to needs. Further, it is configured that, in accordance with a predetermined operation, the imaging signals stored in the memory device of the circuit board 1308 is output to the television monitor 1430 or the personal computer 1440.

Note that the electronic instrument according to the invention can include, in addition to the personal computer (mobile type of personal computer) shown in FIG. 5, the cellular phone shown in FIG. 6, and the digital still camera shown in FIG. 7, for example, a television, a video camera, a video cassette recorder of either a view-finder type or a direct view type, a laptop personal computer, a car navigation system, a pager, a personal digital assistance (including one having a communication function), an electronic dictionary, an electronic calculator, an electronic game machine, a word processor, a workstation, a picture phone, a security television monitor, a electronic binoculars, a POS terminal, a device equipped with a touch panel (e.g., a cash dispenser in banking facilities, an automatic ticket vending machine), a medical instrument (e.g., a electronic thermometer, a blood pressure monitor, a blood glucose monitor, a cardiography display, ultrasonic diagnostic equipment, an endoscope display), a fish finder, various measuring instruments, gauges (e.g., gauges for cars, aircrafts, or boats and ships), a flight simulator, other various monitors, and a projection display device such as a projector.

As described above, although the light emitting element, the display device and the electronic instrument according to the invention are described along the embodiments shown in the accompanying drawings, the invention is not limited to these embodiments.

Specific examples according to the invention are hereinafter described.

SPECIFIC EXAMPLE 1

The light emitting element is manufactured as described below, and the emission efficiency and durability (life) of the light emitting device are evaluated.

Sample No. 1A

1A Firstly, a transparent glass substrate with an average thickness of 0.5 mm is provided.

2A Then, an ITO electrode (anode) with average thickness of 100 nm is formed on the substrate using a sputter process.

3A Then, a chlorobenzene solution is confected by dissolving the triphenylamine polymer (weight-average molecular weight: 40000) shown in Chemical Formula 1 as the first organic polymer so as to obtain the concentration of 0.5 wt %.

And then, the chlorobenzene solution is provided on the ITO electrode using a spin coating process (2000 rpm), and then dried. Thus, the first region of the hole transport layer is formed.

4A Subsequently, the liquid material is confected by adding to xylene triphenylamine polymer (weight-average molecular weight: 5000) shown in Chemical Formula 1 as the second organic polymer to be 0.5 wt % in concentration and zirconium oxide particles plated with iridium complex as the composing material of the light emitting layer to be 2.5 wt % in concentration.

And then, the liquid material is provided on the first region using a spin coating process (2000 rpm), and then dried. Thus, the second region of the hole transport layer and the light emitting layer are formed utilizing the phase separation.

Note that the particle size of the zirconium oxide particles in use is 5 nm.

Further, the coordination number of the iridium complex in use is three, and the ligand is 2,2'-bipyridine-4,4'-dicarboxylic acid.

Further, the drying process for the liquid material is executed under the isopropanol environment at a temperature of 50° C.

Further, the average thickness of the resulted light emitting layer is 40 nm, and the average thickness of the hole transport layer (the total of the first region and the second region) is 70 nm.

5A Subsequently, as a composing material of the intermediate layer, a dispersion liquid is confected by dispersing zirconium oxide particles plated with F17 (a fluorocarbon silane coupling compound) in isopropanol.

And then, the dispersion liquid is provided on the light emitting layer using a spin coating process (2000 rpm), and then dried. Thus, the intermediate layer with an average thickness of 10 nm is formed.

Note that the particle size of the zirconium oxide particles in use is 5 nm.

6A Then, an AlLi electrode (cathode) with an average thickness of 300 nm is formed on the intermediate layer using a vacuum deposition process.

And then, a protective cover (the seal member) made of polycarbonate is provided so as to cover the every layer formed previously, and is fixed and sealed with ultraviolet curing resin to complete the light emitting element.

Sample No. 2A

The light emitting element is manufactured similarly to the sample No. 1A described above except the omission of the step 3A. Note that the hole transport layer is formed to have an average thickness of 70 nm.

Sample No. 3A

Poly(dioctylfluorene-alt-benzothiadiazole) (F8BT) is used as the composing material of the light emitting layer, and the step 4A is modified as described below, and the step 5A described above is omitted. Except these points, the light emitting element is manufactured similarly to the sample No. 1A.

Firstly, triphenylamine polymer (weight-average molecular weight: 5000) shown in Chemical Formula 1 and F8BT are mixed in weight ratio of 1:2, and are dissolved in a xylene solvent to obtain a liquid material of 3 wt % in concentration.

And then, the liquid material is provided on the first region using a spin coating process (3000 rpm), and then dried. Thus, the second region of the hole transport layer and the light emitting layer are formed utilizing the phase separation.

Sample No. 4A

Poly(dioctylfluorene-alt-benzothiadiazole) (F8BT) is used as the composing material of the light emitting layer, and the step 4A is modified as described in sample No. 3A, and the step 5A described above is omitted. Except these points, the light emitting element is manufactured similarly to the sample No. 2A.

And, the emission efficiency is evaluated with respect to each of the light emitting elements of sample No. 1A and sample No. 2A. Further, the life is also evaluated with respect to each of the light emitting elements of sample No. 1A through 4A.

The evaluation of the emission efficiency is carried out by measuring current value while applying direct current voltage of 0V through 6V, and measuring corresponding luminance with a luminance meter. Further, the evaluation of life is carried out by driving with a constant current, which causes the initial luminance of 400 cd/m$^2$.

Figure 8:
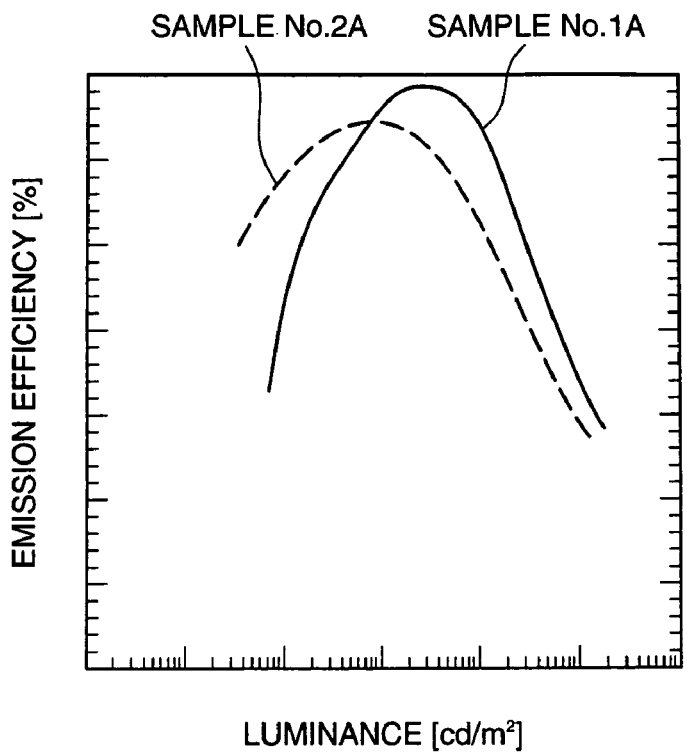
FIG. 8 is a graph showing an evaluation result of the emission efficiency.
Figure 9:
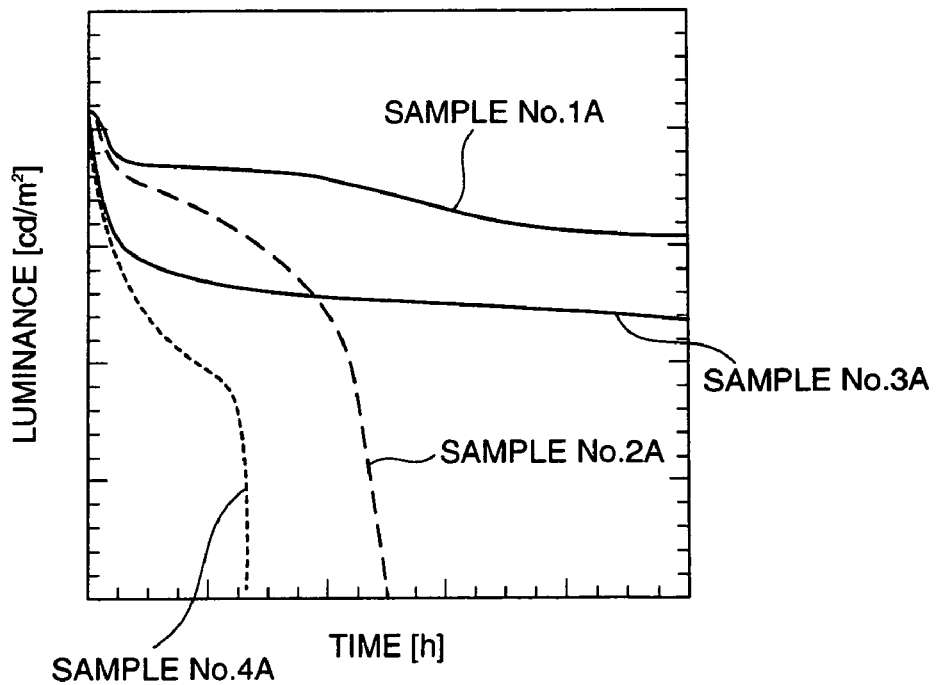
FIG. 9 is a graph showing an evaluation result of the life.

The result of the emission efficiency evaluation is shown in FIG. 8, and the result of the life evaluation is shown in FIG. 9.

As shown in FIG. 8, it is clarified that the light emitting element of sample No. 1A (the light emitting element according to the invention) provided with the second region can achieve high efficiency in the high luminance region. Although not shown in the drawings, the light emitting element of sample No. 3A presents a similar tendency.

Further, as shown in FIG. 9, in each of the light emitting elements of sample No. 1A and 3A (the light emitting element according to the invention) provided with the second region, the luminance drop with elapse of time can be suppressed. Namely, the result indicating a possibility of making the life of the light emitting element longer (enhancing the durability) can be obtained.

Further, the same result can be obtained by selecting the first organic polymer and the second organic polymer respectively from polyarylamine, fluorene-arylamine copolymer, fluorene-bithiophene copolymer, or derivatives thereof, and then forming the light emitting element in the same manner as described above.

SPECIFIC EXAMPLE 2

Ten evaluation objects are manufactured for each of the sample numbers along the methods described below, and the evaluation of current-voltage characteristics is executed with respect to these evaluation objects.

Sample No. 1B

1B Firstly, a transparent glass substrate with an average thickness of 0.5 mm is provided.

2B Then, an ITO electrode with average thickness of 100 nm is formed on the substrate using a vacuum deposition process.

3B Then, a chlorobenzene solution is confected by dissolving the triphenylamine polymer (weight-average molecular weight: 40000) shown in Chemical Formula 1 as the first organic polymer so as to obtain the concentration of 0.5 wt %.

And then, the chlorobenzene solution is provided on the ITO electrode using a spin coating process (2000 rpm), and then dried. Thus, the first region of the hole transport layer is formed.

4B Then, a xylene solution is confected by dissolving the triphenylamine polymer (weight-average molecular weight: 5000) shown in Chemical Formula 1 as the first organic polymer so as to obtain the concentration of 3 wt %.

And then, the xylene solusion is provided on the first region using a spin coating process (2000 rpm), and then dried. Thus, the second region of the hole transport layer is formed.

Note that the average thickness of the resulted hole transport layer (the total of the first region and the second region) is 70 nm.

5B Then, an Al electrode with an average thickness of 300 nm is formed on the hole transport layer using a vacuum deposition process.

Sample No. 2B

The evaluation objects are manufactured in the same manner as in the case of the sample No. 1B except that the hole transport layer with an average thickness of 70 nm is formed only of triphenylamine polymer with weight-average molecular weight of 40000.

Sample No. 3B

The evaluation objects are manufactured in the same manner as in the case of the sample No. 1B except that the hole transport layer with an average thickness of 70 nm is formed only of triphenylamine polymer with weight-average molecular weight of 5000.

And, the current-voltage characteristics are evaluated with respect to each of the evaluation objects of sample No. 1B through 3B.

The evaluation of current-voltage characteristics is carried out by measuring the current value while applying the direct current voltage of −6V through 6V.

As a result, in each of the evaluation objects of the sample No. 1B, the leak current is suppressed in the forward direction, and high current is observed when high voltage is applied.

In contrast, in each of the evaluation objects of the sample No. 2B, the leak current is suppressed, but the absolute current value is low. Further, in the evaluation objects of the sample No. 3B, many objects present short-circuit after a number of times of voltage application.

According to these results, it is clarified that the characteristics of the hole transport layer can be improved by forming the hole transport layer with organic polymers each having different molecular weight. It is inferred that this improvement in the characteristics of the hole transport layer is reflected in the improvement in the characteristics of the light emitting element appeared in the specific example 1 described above.

What is claimed is:

1. A light emitting element, comprising:
   an anode;
   a cathode;
   a hole transport layer disposed between the anode and the cathode and adjacent a side of the anode; and
   a light emitting layer disposed between the anode and the cathode and adjacent a side of the cathode,
   wherein the hole transport layer includes:
   a first region disposed adjacent the side of the anode and composed of a first organic polymer; and
   a second region disposed adjacent the side of the light emitting layer and composed of a second organic polymer having a weight-average molecular weight different from the weight-average molecular weight of the first organic polymer,
   and wherein the weight-average molecular weight of the first organic polymer is greater than the weight-average molecular weight of the second organic polymer.

2. The light emitting element according to claim 1, wherein the weight-average molecular weight of the first organic polymer is no less than 10000.

3. The light emitting element according to claim 1, wherein the weight-average molecular weight of the second organic polymer is no greater than 8000.

4. The light emitting element according to claim 1, wherein the first organic polymer and the second organic polymer are of the same semiconductor material.

5. The light emitting element according to claim 4, wherein the first and the second organic polymers are one of polyarylamine, fluorene-arylamine copolymer, fluorene-bithiophene copolymer, and a derivative of one of polyarylamine, fluorene-arylamine copolymer, and fluorene-bithiophene copolymer.

6. The light emitting element according to claim 1, wherein the first region of the hole transport layer includes a function of one of preventing and suppressing a contact between the light emitting layer and the anode.

7. The light emitting element according to claim 1, wherein the second region of the hole transport layer and the light emitting layer are formed in a batch utilizing phase separation.

8. The light emitting element according to claim 1, wherein the light emitting layer includes polymeric light emitting material.

9. The light emitting element according to claim 1, wherein the light emitting layer is composed mainly of a mixture of an inorganic semiconductor material and a light emitting material.

10. The light emitting element according to claim 9, wherein
    at least a part of the inorganic semiconductor material is plated with the light emitting material in the mixture.

11. The light emitting element according to claim 9, wherein
    the inorganic semiconductor material is composed mainly of a metal oxide.

12. The light emitting element according to claim 11, wherein
    the metal oxide is composed principally of zirconium oxide.

13. The light emitting element according to claim 9, wherein the inorganic semiconductor material is formed of particles.

14. The light emitting element according to claim 13, wherein
    the average grain size of the inorganic semiconductor material is in a range of 0.5 through 10 nm.

15. The light emitting element according to claim 9, wherein
    the light emitting material is composed mainly of a metal complex.

16. The light emitting element according to claim 15, wherein
    the metal complex is composed principally of a complex having iridium as a core metal.

17. A display device comprising the light emitting element according to claim 1.

18. An electronic instrument comprising the display device according to claim 17.

* * * * *